United States Patent

Oh

(10) Patent No.: US 7,051,454 B2
(45) Date of Patent: May 30, 2006

(54) METHOD FOR ETCHING A METAL LAYER IN A SEMICONDUCTOR DEVICE

(75) Inventor: Sang Hun Oh, Bucheon-si (KR)

(73) Assignee: DongbuAnam Semiconductor Inc., Seoul (KR)

( * ) Notice: Subject to any disclaimer, the term of this patent is extended or adjusted under 35 U.S.C. 154(b) by 0 days.

(21) Appl. No.: 10/751,184

(22) Filed: Dec. 30, 2003

(65) Prior Publication Data

US 2004/0154186 A1 Aug. 12, 2004

(30) Foreign Application Priority Data

Dec. 30, 2002 (KR) ...................... 10-2002-0086802

(51) Int. Cl.
*F26B 7/00* (2006.01)
(52) U.S. Cl. ........................ 34/381; 257/349; 134/22.1
(58) Field of Classification Search .................. 34/380, 34/381, 416; 257/349, 354; 134/22.1, 2; 438/695, 715

See application file for complete search history.

(56) References Cited

U.S. PATENT DOCUMENTS

| | | | | |
|---|---|---|---|---|
| 5,433,823 | A | * | 7/1995 | Cain ........................... 438/702 |
| 5,445,710 | A | * | 8/1995 | Hori et al. .................. 438/717 |
| 5,637,153 | A | * | 6/1997 | Niino et al. ............. 134/22.11 |
| 5,788,799 | A | * | 8/1998 | Steger et al. .......... 156/345.37 |
| 6,189,482 | B1 | * | 2/2001 | Zhao et al. ............. 118/723 R |
| 2003/0045098 | A1 | * | 3/2003 | Verhaverbeke et al. ..... 438/689 |

FOREIGN PATENT DOCUMENTS

| | | | | |
|---|---|---|---|---|
| EP | 0 731 501 | | * 9/1996 | .......... 257/E21.312 |
| KR | 2003-226914 | | * 5/2001 | |

* cited by examiner

*Primary Examiner*—S. Gravini
(74) *Attorney, Agent, or Firm*—Andrew D. Fortney

(57) ABSTRACT

A method for etching a metal layer on which an oxide-based ARC layer is coated in a semiconductor device comprises the step of performing a dry cleaning process by using a $Cl_2/CHF_3$ based gas, after dry cleaning the ARC layer by using the oxide-based gas. As a result, the etching rates of the center area and the edge area are substantially same.

16 Claims, 3 Drawing Sheets

METHOD FOR ETCHING A METAL LAYER IN A SEMICONDUCTOR DEVICE

FIELD OF THE INVENTION

The present invention relates to a method for forming metal lines in a semiconductor device; and, more particularly, to a method for simultaneously etching a metal layer throughout the entire surface of a wafer or substrate without causing microloading.

BACKGROUND OF THE INVENTION

Recently, as a semiconductor device becomes highly integrated, in a process for fabricating a semiconductor device, metal lines of about 0.25 μm or smaller in width are required. As a result, it is general to use a DUV (Deep Ultra Violet) photoresist film in forming the metal lines.

As the photoresist film is sensitive to a reflectance of the metal lines, the reflectance should be decreased to form a non-defective photoresist pattern. For the reason, an oxide-based antireflective coating ("ARC") layer coated on the metal lines is widely used.

However, when an in-situ etching process of the ARC layer is performed in a metal etching chamber, functions of the device may be deteriorated due to a microloading effect between a center area and an edge area of a wafer or substrate. The microloading effect becomes more serious in a far edge area being away from the center area.

As an approach for decreasing the microloading effect, there has been proposed a process for improving a uniformity of metal lines. However, such a process has a limitation in overcoming a difference in etching rate between areas of the wafer. The problem is closely related with a deposition of polymers in the chamber. Especially, when a Si—X based ARC material is deposited in the chamber, such phenomenon becomes more severe.

FIGS. 1A and 1B illustrate cross sectional views showing states after etching of an ARC layer 2 and after etching of metal layers 3 and 5, respectively.

As shown in FIG. 1A, in etching the ARC layer 2, the metal layer 3 in a center area of a wafer 4 is exposed earlier than in an edge area of the wafer since the etching rate is higher at the center area than at the edge area.

Also, referring to FIG. 1B, after etching of the metal layer 3, the TiN layer 5 in the edge area is exposed less than in the center area.

That is, in such a conventional process, the etching rate of the ARC layer is greater in the center area than in the edge area so that the metal layer may be excessively etched and there may occur an underetch in the edge area.

When comparing the etching rates in the far edge area and the center area on the basis of a 10 mm wafer edge exclusion, experimental results indicate that the etching rate difference between the edge area and the center area is 1400 Å/min or more.

SUMMARY OF THE INVENTION

It is, therefore, an object of the present invention to provide a method for simultaneously etching a metal layer wherein an etching rate decrease in an edge area of a wafer is prevented by performing an additional dry cleaning process using a fluorine-based gas to eliminate a Si—X based polymer deposited in a chamber, thereby minimizing a microloading effect.

In accordance with a preferred embodiment of the present invention, there is provided a method for etching a metal layer on which an oxide-based ARC layer is coated in a semiconductor device comprising the step of:

performing a dry cleaning process by using a $Cl_2/CHF_3$ based gas, after dry cleaning the ARC layer by using an oxide-based gas.

BRIEF DESCRIPTION OF THE DRAWINGS

The above and other objects and features of the present invention will become apparent from the following description of preferred embodiments, given in conjunction with the accompanying drawings, in which.

DETAILED DESCRIPTION OF THE PREFERRED EMBODIMENTS

Figure 1A:
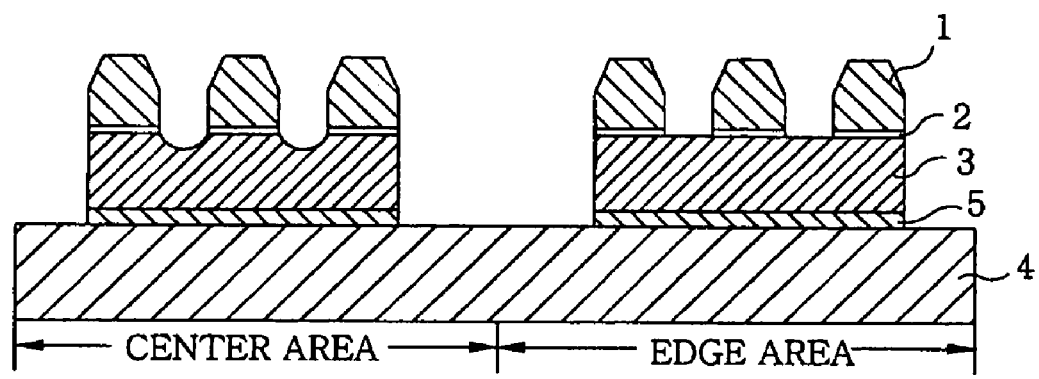
FIGS. 1A and 1B illustrate cross sectional views sequentially showing a conventional process of etching a metal layer.
Figure 1B:
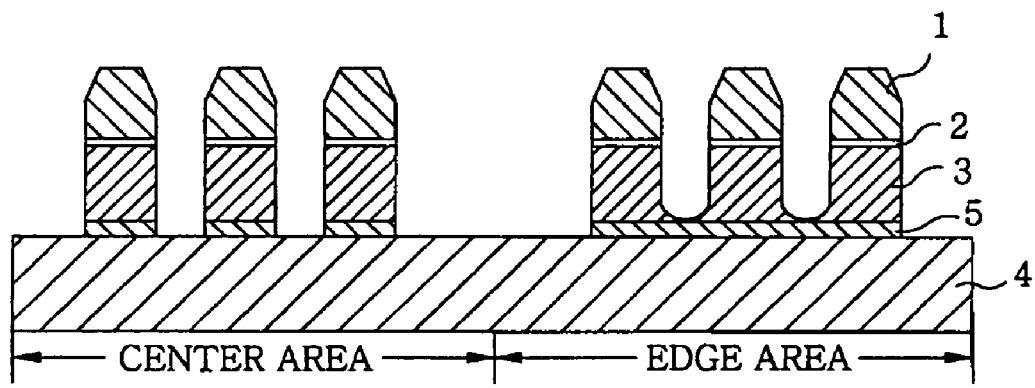

A preferred embodiment of the present invention will now be described in detail with reference to the accompanying drawings, wherein like reference numerals appearing in the drawings represent like parts.

Figure 2A:
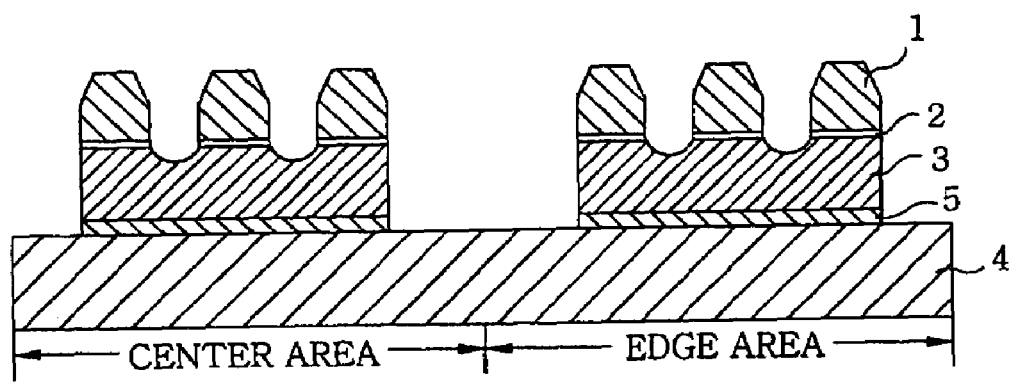
FIGS. 2A and 2B depict cross sectional views sequentially showing a process of etching a metal layer in accordance with a preferred embodiment of the present invention.
Figure 2B:
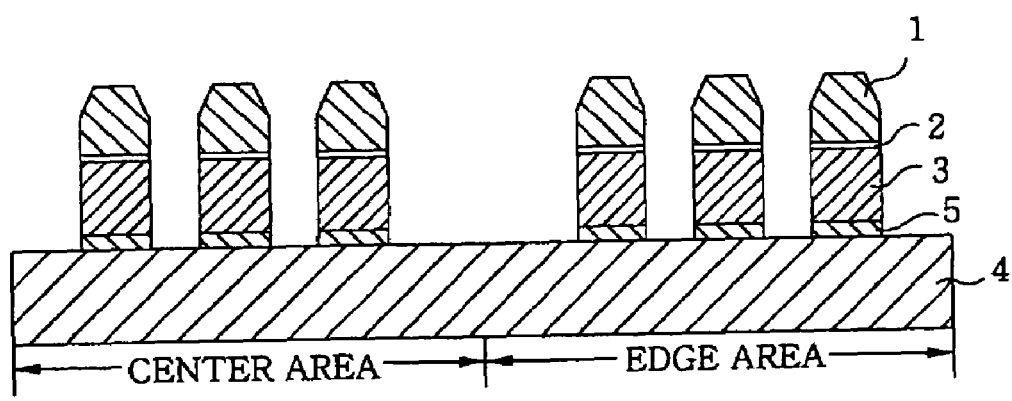

FIGS. 2A and 2B illustrate cross sectional views showing an etching process of an ARC layer 2 and an etching process of metal layers in accordance with the preferred embodiment of the present invention, respectively.

As shown in FIG. 2A, after the ARC layer 2 has been etched, there is substantially no difference between the etching depths in a center area and an edge area of a wafer 4.

As a result, as shown in FIG. 2B, the metal layers 3 and 5 in the center area and the edge area can simultaneously be etched.

This process is carried out by using two steps as indicated in Table 1.

TABLE 1

|  | Pressure (mTorr) | Source power (W) | Bias power (W) | $O_2$ (sccm) | $Cl_2$ (sccm) | $CHF_3$ (sccm) |
| --- | --- | --- | --- | --- | --- | --- |
| First step | 8~50 | 500~1200 | 0~10 | 300~500 | 0 | 0 |
| Second step | 8~50 | 500~1200 | 0~10 | 0 | 100~200 | 5~30 |

* sccm: Standard Cubic Centimeter per Minute

As in the second step of Table 1, in order to eliminate polymers, e.g., $AlCl_x$ and Si—X, which are byproducts deposited in a metal etching chamber, a $Cl_2/CHF_3$ based dry cleaning process is employed; and, therefore, the process results as shown in FIGS. 2A and 2B are obtained.

At this time, the process is preferably performed for about 5 seconds to about 30 seconds.

Figure 3:
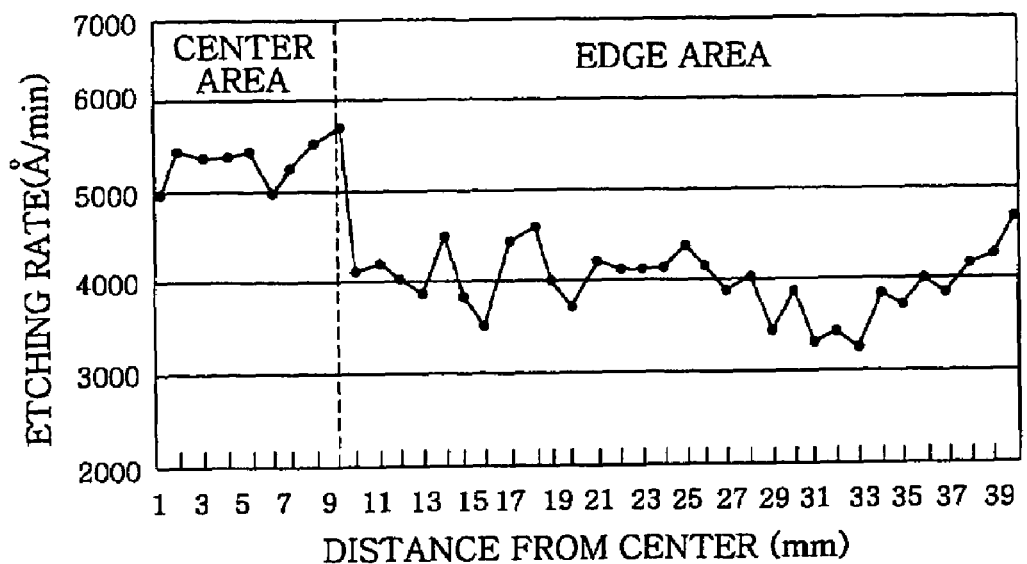
FIG. 3 shows a graph of an etching rate comparison between the conventional method and the present invention.
Figure 3:
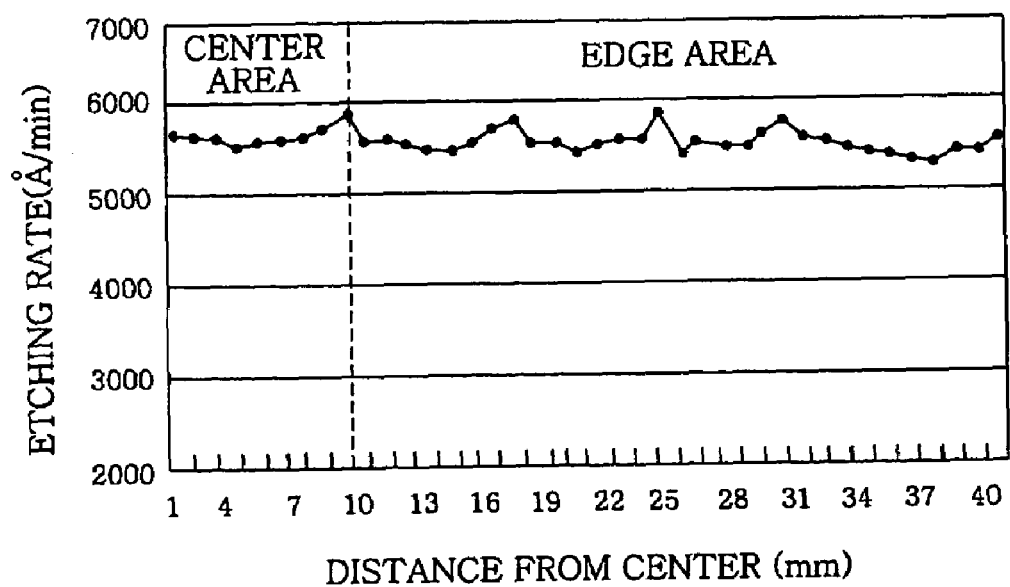

FIG. 3 shows a graph of an etching rate comparison between a conventional process and the process of the present invention.

As shown in FIG. 3, because a microloading effect of the etching rate in the present invention is less than that of the conventional method, the etching rates of the center area and the edge area are substantially same.

Here, in the edge area, the data of FIG. 3 were obtained on the basis of a 10 mm wafer-edge exclusion.

In accordance with the present invention, the etching rate in the edge area is not decreased, because the etching process at the edge area is not hindered.

Experimentally, when comparing the etching rates in the center area and the far edge area on the basis of the 10 mm wafer-edge exclusion, there is substantially no difference therebetween, thereby preventing the underetch which may occur in the far edge area.

As a result, the reliability of the metal etching process is improved, and in the etching process of the metal layers 3 and 5 having the ARC layer 2 thereon, a seasoning effect which may occur by a dry cleaning is reduced.

While the invention has been shown and described with respect to the preferred embodiments, it will be understood by those skilled in the art that various changes and modifications may be made without departing from the spirit and scope of the invention as defined in the following claims.

What is claimed is:

1. A method for etching a metal layer having an oxide-based antireflective coating (ARC) layer thereon comprising the steps of:
    performing a first dry cleaning process in an etching chamber with an oxide-based gas;
    performing a second dry cleaning process in the chamber with a gas mixture comprising $Cl_2$ and $CHF_3$; then etching the metal layer.

2. The method of claim 1, wherein a flow rate of the $Cl_2$ ranges from about 100 seem to about 200 seem.

3. The method of claim 1, wherein a flow rate of the $CHF_3$ ranges from about 5 seem to about 30 seem.

4. The method of claim 1, wherein a pressure of the dry cleaning processes ranges from about 8 mTorr to about 50 mTorr.

5. The method of claim 1, wherein a source power of the dry cleaning processes ranges from about 500 W to about 1200 W.

6. The method of claim 1, wherein a bias power of the dry cleaning processes ranges from about 0 W to about 10 W.

7. The method of claim 1, wherein the dry cleaning processes arc performed for about 5 seconds to about 30 seconds.

8. The method of claim 1, wherein the oxide-based gas comprises oxygen.

9. The method of claim 1, wherein the dry cleaning processes are performed sequentially in a single etching chamber.

10. The method of claim 1, wherein the metal layer and ARC layer are on a wafer having a center area and an edge area, and the dry cleaning processes decrease a microloading effect in the edge area.

11. The method of claim 10, wherein the metal layer is etched at a rate that is substantially the same in the center area and the edge area.

12. The method of claim 1, wherein the second dry cleaning process eliminates polymers deposited in the chamber.

13. The method of claim 1, wherein the second dry cleaning process eliminates aluminum- and silicon-containing byproducts.

14. The method of claim 1, wherein the metal layer comprises an aluminum layer.

15. The method of claim 14, wherein the metal layer further comprises a titanium nitride layer under the aluminum layer.

16. The method of claim 1, wherein the ARC layer comprises a silicon oxide.

* * * * *